United States Patent [19]

Rickborn et al.

[11] Patent Number: 4,686,116

[45] Date of Patent: Aug. 11, 1987

[54] PROCESS FOR COATING SMALL REFRACTORY PARTICLES

[75] Inventors: Steven F. Rickborn, San Jose; Donald Z. Rogers, Menlo Park, both of Calif.

[73] Assignee: Northrop Corporation, Hawthorne, Calif.

[21] Appl. No.: 831,602

[22] Filed: Feb. 21, 1986

Related U.S. Application Data

[63] Continuation-in-part of Ser. No. 761,747, Aug. 1, 1985, which is a continuation-in-part of Ser. No. 672,396, Nov. 16, 1984, abandoned.

[51] Int. Cl.[4] .................. B05D 7/00; C23C 16/26
[52] U.S. Cl. .................. 427/215; 427/122; 427/249; 427/255
[58] Field of Search .............. 427/215, 220, 228, 249, 427/255, 122, 242

[56] References Cited

U.S. PATENT DOCUMENTS

| | | | |
|---|---|---|---|
| 3,854,979 | 12/1974 | Rossi | 427/228 |
| 3,940,509 | 2/1976 | Youtsey et al. | 427/228 |
| 3,949,106 | 4/1976 | Araki et al. | 427/249 |
| 3,995,143 | 11/1976 | Hervert | 427/249 |
| 4,136,213 | 1/1979 | Fung et al. | 427/249 |
| 4,533,572 | 8/1985 | Neelameggham et al. | 427/228 |
| 4,578,313 | 3/1986 | Ito et al. | 427/228 |

*Primary Examiner*—Sadie L. Childs
*Attorney, Agent, or Firm*—Fliesler, Dubb, Meyer & Lovejoy

[57] ABSTRACT

A method is set forth of chemically vapor depositing a substantially uniform carbonaceous film on to each of a plurality of small refractory particles. Uncoated small refractory particles are intimately intermixed with an organic precursor in liquid or solid form, the intermixing being at a temperature below the sublimation, boiling or decomposition temperature of the precursor. The resulting intimate intermixture is subjected to a temperature of 700° C. to 1200° C. in a deposition zone which is substantially oxygen-free. Residence time in the deposition zone is restricted to be less than that which would deleteriously effect properties of the resulting coated particles. The organic precursor, under the residence time and temperature conditions in the deposition zone, is substantially completely converted by sublimation, boiling and/or decomposition to one or more vaporous species. The organic precursor is selected to either (1) sublime or boil at a temperature in excess of about 400° C. or (2) to not decompose at a temperature below about 300° C. if the organic precursor decomposes at a temperature below its sublimation or boiling temperature, to form the one or more vaporous species. Particles produced by the method are substantially uniformly coated over their entire exposed surfaces and the amount of coating can be closely controlled thereby closely controlling the resulting electrical properties of the coated particles.

11 Claims, No Drawings

4,686,116

PROCESS FOR COATING SMALL REFRACTORY PARTICLES

CROSS-REFERENCE

This application is a continuation-in-part of co-pending application Ser. No. 761,747, filed Aug. 1, 1985 which is a continuation-in-part of application Ser. No. 672,396, filed Nov. 16, 1984, now abandoned and both commonly assigned herewith.

TECHNICAL FIELD

The invention relates to a method of forming a substantially uniform electrically conducting film on a plurality of small refractory particles. The particles may be used as filler materials to provide articles of controlled electrical properties and density, or, as flowing electrodes.

BACKGROUND ART

Chemical vapor deposition is a well known technique and is known to provide coatings and films with properties superior to that obtained by other methods, such as sputtering or in situ pyrolysis of a pre-existing film. Chemical vapor deposition provides greater uniformity, adherence, and control of properties than do alternate coating methods. Pyrolysis of a non-volatile organic film on a surface is, in particular, inferior to chemical vapor deposition in these regards. Chemical vapor deposition as now practiced employs gaseous precursors and is often conducted at reduced pressures. Such reduced pressures are often necessary to achieve uniformity. The necessity to work at reduced pressures is a serious disadvantage in that it reduces production rates and requires relatively expensive equipment.

The production of coated refractory fibers is known, as taught, for example, in U.S. Pat. No. 3,428,519, issued Feb. 18, 1969 to Carl M. Zavanut and in U.S. Pat. No. 3,565,683, issued Feb. 23, 1971 to Charles R. Morelock. These and similar processes for the deposition of carbonaceous coatings require that a long continuous fiber be drawn through a heated reaction zone. Because of their small size, small particles and short fibers cannot be coated by these methods. And, if long continuous fibers are made by the methods taught by these patents and then chopped into smaller particles or short fibers, the resulting smaller particles or short fibers will not have substantially their entire surfaces coated with the carbonaceous coatings since the surfaces where the breaks occur will be fresh uncoated surfaces.

U.S. Pat. No. 4,510,077, issued Apr. 9, 1985, to Richard K. Elton, discloses the preparation of short glass fibers coated with a carbonaceous film by in situ pyrolysis of a coating chosen to pyrolize below its boiling or sublimation point. The method taught by Elton is specifically an in situ pyrolysis of a pre-existing film, and is not a chemical vapor deposition process.

The preparation of carbonaceous films on particles by pyrolysis of volatile organic vapors is known. For example, U.S. Pat. No. 3,651,386, issued Mar. 21, 1972, to Karl J. Youtsey, et al., discloses the preparation of coated refractory oxide particles by passing a volatile organic vapor through a stationary bed of such particles at a high temperature. U.S. Pat. No. 3,997,689, issued Dec. 14, 1976, to George L. Herbert, describes a process for coating refractory oxide particles in which the particles are maintained in a semi-fluidized state and a volatile organic vapor is passed through the semi-fluidized particles. Processes involving passing organic vapor through a stationary bed of particles are unlikely to provide a even amount of coating from one particle to the next since the organic vapor is depleted as it rises through the bed, and uneven gas flows are unlikely to occur. While the uniformity of such processes can be improved by maintaining the particles in a fluid or semi-fluid state, many desirable particles cannot be maintained in a fluid or semi-fluid state. In particular, particles such as short fibers that are not substantially spherical cannot be maintained in a fluid state. Also, some spherical particles, such as hollow microspheres, cannot be fluidized at the temperatures required for deposition of carbonaceous films because of the agglomerative properties of the particles. Difficulties and limitations involved in maintaining fluidized beds of hollow silica microspheres are described in, for example, Proceedings of the Conference on Chemical Vapor Deposition Fifth International Conference, Edited by J. M. Blocher, H. E. Hintermann and L. H. Hall, The Electrochemical Society, Princeton, New Jersey, 1975, in an article entitled "Microspherical Laser Targets by CVD" by William J. McCreary, pages 714–725.

The prior art neither teaches nor suggests that chemical vapor deposition processes may be carried out by heating, in the substantial absence of oxygen, an intimate mixture of a plurality of small particles and an appropriately chosen solid precursor. Indeed, the prior art would lead one of ordinary skill in the chemical vapor deposition art to avoid the use of such an intimate mixture as a method for practicing chemical vapor deposition.

DISCLOSURE OF INVENTION

The present invention is directed to solving one or more of the problems as set forth above.

In accordance with the present invention a method is set forth of chemically vapor depositing a substantially uniform carbonaceous film on to substantially each of a plurality of small refractory particles. The method comprises intimately intermixing a plurality of uncoated small refractory particles with an organic precursor in liquid or solid form, the intermixing being at a temperature below the sublimation, boiling or decomposition temperature of the organic precursor. The method further includes subjecting the intimate intermixture to a temperature which falls within a range from about 700° C. to about 1200° C. in a deposition zone which is maintained substantially oxygen-free, the residence time in the deposition zone being restricted to be less than that which would deleteriously affect the properties of the particles having the vapor deposited film thereon. The organic precursor, under the residence time and temperature conditions in the deposition zone, is selected to be substantially completely converted by sublimation, boiling and/or decomposition, to one or more vaporous species in the deposition zone and is selected to either (1) sublime or boil at a temperature in excess of about 400° C. or (2) to not decompose at a temperature below about 300° C. if the organic precursor decomposes at a temperature below its sublimation or boiling temperature, to form the aforementioned one or more vaporous species.

Operation in accordance with the method of the present invention provides a substantially uniform carbonaceous film on each of a plurality of small refractory particles, which plurality of refractory particles has a controllable resistance through control of particle size, particle shape, coating thickness and processing conditions. The particles may be subjected to the conditions of the deposition zone by virtually any method. For example, the mixture may be placed in a vessel made of a refractory material and the vessel placed in a furnace. Alternatively, the intimate mixture may be continuously transported through a hot zone by any of the known methods of mass transport such as a conveyor belt or a screw feeder. A rotary kiln can also be used. If coated particles are made in accordance with the method of the present invention they have particularly good conductive properties. Thus, if they are incorporated into a resin or other matrix they impart particularly good electrical properties to the matrix. A plurality of these particles can be used as a flowing electrode. The fact that the coating substantially equally covers the entire exterior surface of the particles is important to this use since good conductivity is otherwise difficult to obtain from one coated particle to the next.

BEST MODE FOR CARRYING OUT INVENTION

In accordance with the present invention a process is set forth for chemical vapor deposition of a carbonaceous film on to a plurality of small particles of a refractory material. The resulting product is a plurality of such small particles having a coating or film thereon of controllable uniformity whereby the particles have a controllable resistance. Substantially the entire exterior surface of substantially each of the particles is substantially uniformly covered by the film.

The particles are preferably formed of a refractory ceramic material, for example of a refractory metal oxide such as for instance: $Al_2O_3$, $Al_2O_3 \cdot K_2O \cdot SiO_2$, $Al_2(SiF_6)_2$, $Al_2SiO_5$, $BaO$, $BaSO_4$, $Ba_2V_2O_7$, $3BeO \cdot Al_2O_3 \cdot 6SiO_2$, $BeO$, $Cd_2P_2O_7 \cdot 2H_2O$, $CdSiO_3$, $CaO$, $CaSiO_3$, $CaSO_4$, $Ce_2O_3$, $Cr_2O_3$, $Cr(PO_4) \cdot 3H_2O$, $Fe_3O_4$, $HfO_2$, $La_2O_3$, $PbO$, $PbWO_4$, $Li_4SiO_4$, $MgO$, $MnP_2O_7$, $MnSiO_3$, $MoO_3$, $Mo_2O_3$, $NiO$, $Ni_2O_3$, $SiO_2$, $SrSiO_3$, $SrO$, $Ta_2O_5$, $TiO_2$, $Ti_2O_3$, $WO_3$, $W_2Si_3$, $UO_2$, $V_2O_3$, $V_2O_4$, $Zr(OH)_2$, $ZrO_2$, non-oxide ceramic refractories such as carbides, e.g., silicon carbide, nitrides, e.g., boron nitride or metal nitrides or mixtures of ceramic refractory materials such as aluminum borosilicate, etc. Other useful materials include refractory vitreous materials such as silicate glass or magnesium aluminosilicate glass.

In accordance with the present invention a method is set forth of obtaining an electrically conductive material which may be in the nature of a substantially spherical refractory particle having an exterior surface having a diameter of no more than about 5 millimeters and more preferably no more than about 1 millimeter. Generally, such refractory particles will be present in large number. The spheres are hollow, having a central void whereby they are light in weight yet have good structural integrity. Alternatively, the particles may be in the nature of short fibers, generally 5 mm or less in length, small irregular particles having a maximum dimension of generally 5 mm or less, or any other desired shape but having a maximum dimension of generally 5 mm or less, or more preferably 1 mm or less.

An electrically conductive coating is present which substantially equally covers substantially the entire exterior surface of substantially each of the particles. The coating is generally from about 10 Angstroms to about 5000 Angstroms in thickness. Also, the coating must have at least about 70 atomic percent carbon. The preferred coating contains at least about 80 atomic percent carbon.

In accordance with the present invention, the conductive coating encapsulates the originally uncoated particle substantially equally over its entire exterior surface. Substantially each coated particle is substantially completely coated with the coating. The coating is applied in a sufficient quantity to render the particles electrically conducting with a bulk resistance of the desired value. In the preferred mode of the invention, the bulk resistance is between 1 ohm and 500K ohms although particles with other bulk resistances can also be produced.

The bulk resistance of the coated particles 10 is measured by the following procedure. Twenty milliliters of the coated particles are placed in an insulating chamber with an insulating base measuring $1'' \times 1''$, and with two of the opposite interior sides completely covered with nickel plates. The sample is settled by gentle vibration and then compressed by a cover weighing 22.2 grams that completely covers the top surface of the particles in the chamber. The system is then allowed to stabilize for ten minutes. The bulk resistance of the coated particles is equal to the resistance between the nickel plates. Basically the coating is a pyrolyzed carbon coating.

The conductive coating which encapsulates the particles must comprise no more than about 17 weight percent of the particles, preferably no more than about 5 weight percent of the particles and still more preferably no more than about 2 weight percent of the particles. The coating preferably comprises at least about 0.001 weight percent of the particles.

The refractory material of particles may be of the nature of a vitreous or a ceramic material having the above discussed voids therein. Such spheres are readily available commercially and sold, for example, under the trademark "ECCOSPHERES" by the Emerson and Cuming division of W.R. Grace and Co. Such spheres are conventionally used, for example, in syntactic foam materials for buoyancy applications. They are free flowing thin-walled hollow glass and ceramic spheres approximately 10 to 300 microns in diameter. They have a true particle density of approximately one-tenth that of other commonly used inorganic fillers. Wall thickness is about 1.5 microns. Bulk density is about 0.15 gram per cc. Such spheres are describes in Technical Bulletin 14-2-2 published by Emerson and Cuming as revised in April 1978. Generally, they are made of silicon dioxide.

Prior to coating the particles it is advisable to thoroughly outgas them and dehydrate them. This can be accomplished, for example, by placing them in the system in which they are to be coated with the conductive coating and slowly raising the temperature, for example, by 75° C. increments, to a temperature of about 300° C. and then leaving the uncoated particles at this temperature for, for example, 15 hours. Thereafter the temperature is increased to the coating temperature. Alternatively, the uncoated particles can first be degassed and then cooled down, mixed with the precursor and placed in the system for carrying out of any of the various methods mentioned above.

In accordance with the process of the invention an organic precursor is applied to the uncoated particles in liquid and/or solid form. In some instances a solution of the organic precursor will be applied and the solvent removed, e.g., evaporated, to leave the dried organic precursor on the particles. The applying occurs at a temperature below the sublimation, boiling or decomposition temperature of the organic precursor, generally at ambient temperature. Virtually any method of applying the precursor may be used, provided only that the method of such applying yields a reasonably uniform distribution of the precursor on the particles. The particles are positioned in a hot chemical vapor deposition zone, and then, after being positioned in the hot chemical deposition zone for a sufficient time for the precursor to be substantially completely converted by sublimation, boiling and/or decomposition to one or more vaporous species, are taken out of the hot chemical vapor deposition zone.

In the case wherein the organic precursor is one which will sublime or boil prior to decomposition, such precursor should be selected to be one which sublimes or boils at a temperature in excess of about 400° C. and below about the temperature maintained in the hot chemical deposition zone. In the case wherein the organic precursor is of such a nature that it decomposes at a temperature below its sublimation or boiling temperature, such decomposition temperature should be above about 300° C.

It is essential to the practice of the present invention that the organic precursor, under the residence time and temperature conditions of the deposition zone, be selected to be substantially completely converted by sublimation, boiling and/or decomposition to one or more vaporous species under the conditions in the deposition zone. This assures that the process being carried out is one of chemical vapor deposition as opposed to mere surface charring.

Generally, the residence time of each of the particles in the deposition zone will be no more than about 100 minutes. It is an advantage to the practice of the present invention that the residence time of the particles within the deposition zone can be restricted to be less than about 30 minutes and preferably less than about 15 minutes since this assures a high production rate. The minimum residence time is that which will be just sufficient to convert substantially all of the precursor to one or more vaporous species.

The temperature within the hot chemical vapor deposition zone must be maintained within a range which falls between about 700° C. and about 1200° C. If lower temperatures than 700° C. are utilized the vapor species resulting from the organic precursor are not sufficiently pyrolyzed to form a coating of the desired properties. If higher temperatures are utilized the properties of the particles may be deleteriously effected.

The deposition zone must be maintained substantially oxygen-free. This can be accomplished by working under an inert atmosphere, for example, nitrogen, argon, or the like, or working with a vacuum with the only pressure being that due to the vapor species produced from the organic precursor. For ease of operation it is preferred that the process be carried out under an inert atmosphere. In such an instance the inert atmosphere can be utilized to keep oxygen out of the hot chemical vapor deposition zone.

It should be noted that it is not essential that the organic precursor cover the entire surface of all of the particles although such is preferable. Since the process taking place in the hot chemical vapor deposition zone is true chemical vapor deposition, it is possible to cover only a portion of the particles and still to obtain uniform coating of the film on all of the particles. However, since the vaporous species tend to deposit somewhat near to the point of their formation, it is desirable to have a relatively uniform coating of the precursor on substantially all of the particles.

When an inert atmosphere is utilized in the hot chemical vapor deposition zone the inert atmosphere will generally be swept through the hot vapor deposition zone to remove any undesired pyrolysis products. A vacuum pump may be used to impel this flow or, it may be impelled simply by introduction of the inert gas under pressure. When a vacuum is used in the hot chemical vapor deposition zone any undesired pyrolysis products will be removed by the vacuum in a conventional manner.

An advantage of the present invention is that great control of uniformity can be achieved. The uniformity of coating achieved by the present invention cannot be achieved by coating processes described in the prior art. A second advantage of the present invention is that it allows the manufacture of the coated particles at low cost.

The chemical structure of the organic precursor is of virtually no importance to the practice of the present invention so long as it has the sublimation, boiling, and/or decomposition temperature ranges as described above. Generally, the organic precursor will be selected from organic precursors in which a majority of the atoms of the compound are carbon and hydrogen atoms. It is essential to the practice of the present invention that the organic precursor be substantially completely converted by sublimation, boiling and/or decomposition to one or more vaporous species in the deposition zone. The chemical vapor deposition which occurs in the zone is, in essence, the chemical vapor deposition of the vaporous species produced from the organic precursor. That is, what is occurring is true chemical vapor deposition rather than mere charring on the surface of the particles.

The invention will be better understood by reference to the following illustrative examples:

EXAMPLE 1

Free flowing hollow fused silica spheres (Eccospheres®) (8.92 gram) were mixed with 1.79 gram zinc phthalocyanine. The mixture was placed in a quartz tube which was evacuated to 0.007 Torr. The temperature of the mixture was raised to 300° C. over 4.5 hours, and then held at 300° C. for 15 hours. The temperature was then raised to 900° C. over 5 hours, and kept at 900° C. for 2 hours. During this time the pressure rose to 0.20 Torr. The system was then cooled while maintaining vacuum. The product was removed from the quartz tube, and passed through a 70 mesh screen to remove agglomerated material. The material that passed through the 70 mesh screen was collected to give 7.2 grams of coated spheres. The bulk resistance of the coated particles was measured by the method described herein and was found to be 487 ohms. The composition of the film was: C—84.34%, H—0.72%, N—13.99%, Zn—0.94%. The film comprised 1.38 weight percent of the total weight of the coated particles as calculated from the elemental anaylsis. Examination of the coated particles under an optical microscope showed each particle to be totally encapsulated with an even coating of the film. This example demonstrates particle coating in a vacuum.

EXAMPLE 2

Hollow fused silica spheres (Eccospheres ®) (7.76 gram) were mixed with 0.155 gram zinc phthalocyanine and placed in a quartz reactor. The reactor was purged three times by evacuation and backfilling with nitrogen. The open end of the reactor was then connected to a nitrogen source and a bubbler so that a slight positive pressure of nitrogen was maintained in the reactor, while preventing any pressure buildup. The reactor was then heated to 800° C. over 21 minutes, held at 800° C. for 30 minutes, and allowed to cool. This provided 7.34 gram of coated hollow spheres. Examination under an optical microscope showed each particle to be individually and completely encapsulated with a thin carbon film. The bulk resistance of the coated particles was 385 ohm. The composition of the film was: C—77.20%, H—1.77%, N—15.94%, Zn—5.3%. The film comprised 0.79 weight percent of the total weight of the coated particles. This example demonstrates particle coating in an inert atmosphere at ambient pressure.

EXAMPLE 3

Hollow fused silica spheres (Eccospheres ®) (7.89 gram) were mixed with 0.16 gram hydrogen phthalocyanine and placed in a quartz reactor. The reactor was purged and placed under a nitrogen atmosphere as in Example 2. The reactor was heated to 850° C. over 20 minutes, and then allowed to cool. The coated particles were passed through a 70 mesh screen to give 7.08 gram coated particles, with a bulk resistance of 4.26 Kohm. The composition of the film was: C—79.58%, H—7.75%, N—12.67%. The film comprised 0.142 weight percent of the total weight of the coated particles. This example demonstrates that precursors other than zinc phthalocyanine may be used, and that the observed conductivity of the coated particles are not due to any metal content of the film.

EXAMPLE 4

Hollow aluminum oxide microspheres (Emerson & Cuming Eccospheres ® FAB) (20.6 grams) were mixed with 0.20 gram zinc phthalocyanine and placed in a quartz reactor. The reactor was purged and placed under a nitrogen atmosphere as in Example 2. The reactor was heated to 900° C. over 30 minutes, then left at 900° C. for an additional 30 minutes, then allowed to cool under a nitrogen atmosphere. The resulting coated particles were passed through a seventy mesh screen to give 17.6 gram coated particles, with a bulk resistance of 1.05 Kohm. The composition of the film was: C—88.80%, H—1.06%, N—7.18%, Zn—2.96%. The film comprised 0.4771% of the total weight of the coated particles. This example demonstrates that ceramic particles composed of materials other than silicon dioxide may be used.

EXAMPLE 5

Hollow fused silica spheres (Eccospheres ®) (7.92 gram) were mixed with powdered polyacrylonitrile (0.40 gram) and placed in a quartz reactor. The reactor was purged and placed under a nitrogen atmospheres as in Example 2. The reactor was heated to 800° C. over 28 minutes, kept at 800° C. for 30 minutes, and then allowed to cool. The coated particles were passed through a 70 mesh screen to give 6.31 gram coated particles, with a bulk resistance of 21 Kohm. The composition of the film was: C—77.42%, H—1.90%, N—20.68%. The film comprised 1.581 weight percent of the total weight of the coated particles. This example demonstrates that precursors other than phthalocyanines may be used.

EXAMPLE 6

Aluminum oxide particles (140 to 325 mesh) were dehydrated by heating to 800° C. in vacuum. The particles were solid, with an irregular shape and a high surface area. The dehydrated aluminum oxide (52.09 gram) was mixed with zinc phthalocyanine (1.04 gram) and placed in a quartz reactor. The reactor was purged and placed under a nitrogen atmosphere as in Example 2. The reactor was heated to 800° C. over 46 minutes, kept at 800° C. for 30 minutes, and then allowed to cool. The coated particles weighed in total 51.76 gram, and were seen to be entirely coated by examination under an optical microscope. The coated particles were black in appearance. The bulk resistance of the coated particles was greater than 20 Mohm. The carbon in the film comprised 0.975% of the total weight of the coated particles. Accurate film compositions could not be obtained because of reabsorption of water by the alumina particles.

This example demonstrates that the shape and surface area of the particle strongly effect the bulk resistance of the coated particles.

EXAMPLE 7

S-Glass fibers (204.23 gram) with an average length of 1/6 inch (4.2 mm) were thoroughly mixed with zinc phthalocyanine powder (4.08 gram), and the mixture placed in a quartz reactor. The reactor was purged and placed under a nitrogen atmosphere as in Example 2. The reactor was heated to 800° C. over 42 minutes, and maintained at 800° C. for 30 minutes. The mixture was then cooled under a slight positive pressure of nitrogen. The resulting mass was manually crumbled and sieved for 30 minutes through a 40 mesh sieve to give 177.84 gram free flowing S-Glass fibers uniformly coated with a carbonaceous film. The composition of the film was: C—80.54%, H—0.89%, N—11.50%, Zn—7.06%. The film comprised 1.24% of the total weight of the coated fibers. The bulk resistance of the coated fibers was 960±59 ohms.

EXAMPLE 8

Short (<1 mm average length) aluminum borosilicate fibers (sold by 3M under the Trademark Nextel ®) (1.1 gram) were thoroughly mixed with zinc phthalocyanine powder (0.022 gram) and the mixture was placed in a quartz reactor. The reactor was purged and placed under a nitrogen atmosphere as in Example 2. The reactor was heated to 800° C. over 34 minutes and maintained at 800° C. for 30 minutes. The reactor was then cooled under an atmosphere of nitrogen, giving 0.99 gram Nextel ® fibers with a uniform and complete carbonaceous coating. A mat of these fibers placed on an insulating surface had a sheet resistance of 20 Kohm/square. The composition of the film was: C—69.18%, H—2.4%, N—13.92%, Zn—14.50%. The film comprised 0.503 of the total weight of the coated fibers.

EXAMPLE 9

Rigorously dehydrated calcium oxide powder (27.04 gram) was thoroughly mixed with zinc phthalocyanine powder (0.54 gram) and the mixture placed in a quartz reactor. The reactor was purged and placed under a nitrogen atmosphere as in Example 2. The reactor was heated to 800° C. over 46 minutes and maintained at 800° C. for 30 minutes. The reactor was then cooled under an atmosphere of nitrogen, giving 26.77 gram of coated calcium oxide as a free flowing powder. The bulk resistance of the coated particles was 2.06 Kohm.

EXAMPLE 10

Hollow fused silica microspheres (Eccospheres ®), (23.39 gram) were mixed with 0.36 gram zinc phthalocyanine and the mixture placed in a tubular quartz reactor. The reactor was flushed with nitrogen gas. The reactor was rotated at approximately 100 rpm, and a flow nitrogen of approximately 100 ml/minute passed through the tube. The temperature of the reactor was then raised to 200° C. for one hour in order to dehydrate the hollow microspheres.

After this time, the rotation of the reactor was continued, but one end was sealed. A slight positive pressure of nitrogen, with an automatic pressure vent, was maintained in the reactor. The temperature of the reactor was then raised to 800° C. over 50 minutes and maintained at 800° C. for 30 minutes. The reactor was then allowed to cool under nitrogen.

This procedure provided free flowing coated hollow microspheres directly, without the need for any crushing or sizing of the product. The bulk resistance of the coated microspheres was 542. The composition of the film was C—78.27%, H—3.46%, N—13.62% and Zn—4.65%. The film comprised 0.46% of the total weight of the coated particles.

This example demonstrates the preliminary dehydration of the particulate to be coated and the use of reactor agitation to improve the properties of the coated particulate.

Industrial Applicability

Particles 12 made in accordance with the present invention are useful as filler materials. They are also useful as flowing electrodes. The resultant products have controllable conducting properties.

While the invention has been described in connection with certain specific embodiments thereof it will be realized by those skilled in the art that the invention has further uses and objectives and that the invention herein covers such other uses and objectives and is as set forth in the appended claims.

We claim:
1. A chemical vapor deposition method for depositing a substantially uniform carbonaceous vapor deposited film on to substantially each of a plurality of small refractory particles, comprising:
   intimately intermixing a plurality of uncoated small refractory particles with an organic precursor in liquid or solid form, the intermixing being at a temperature below the sublimation, boiling or decomposition temperature of the organic precursor; and
   subjecting the intimate intermixture of particles and precursor to a temperature which falls within a range from about 700° C. to about 1200° C. in a deposition zone which is maintained substantially oxygen-free, the residence time in the deposition zone being restricted to be less than that which would deleteriously effect the properties of the particles having the vapor deposited film thereon, the organic precursor, under the residence time and temperature conditions in the deposition zone, being selected to be substantially completely converted, by at least one of sublimation, boiling and decomposition, to one or more vaporous species in said deposition zone and being selected to either (1) sublime or boil at a temperature in excess of about 400° C. or (2) to not decompose at a temperture below about 300° C. if said organic precursor decomposes at a temperature below its sublimation or boiling temperature, to form said one or more vaporous species.

2. A method as set forth in claim 1, wherein said residence time is no more than about 100 minutes.

3. A process as set forth in claim 1, wherein said residence time is no more than about 30 minutes.

4. A method as set forth in claim 1, wherein said intimate intermixing step applies substantially an equal quantity of said organic precursor to substantially each of said particles to provide the resulting coated particles with a substantially uniform resistance.

5. A method as set forth in claim 1, wherein said deposition zone has an inert gas atmosphere.

6. A method as set forth in claim 1, wherein said deposition zone is maintained substantially under vacuum save for said one or more vaporous species.

7. A method as set forth in claim 1, further including:
   continuously removing vaporous byproducts from said deposition zone.

8. A method as set forth in claim 1, wherein each of said particles is covered over substantially its entire exposed surface with said carbonaceous film.

9. A process as set forth in claim 1, wherein said particles comprise hollow spheres.

10. A method as set forth in claim 1, wherein said organic precursor is in solution and including, after said intimate intermixing and before said subjecting step, allowing said solution to dry.

11. A method as set forth in claim 1, further including, during said subjecting step, agitating said intimate intermixture of particles.

* * * * *